(12) United States Patent
Miura

(10) Patent No.: US 7,710,738 B2
(45) Date of Patent: May 4, 2010

(54) LEAD-TYPE ELECTRONIC-PART-MOUNTED PRINTED CIRCUIT BOARD, METHOD OF SOLDERING LEAD-TYPE ELECTRONIC PART AND AIR-CONDITIONER

(75) Inventor: Tsuyoshi Miura, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 821 days.

(21) Appl. No.: 11/516,565

(22) Filed: Sep. 7, 2006

(65) Prior Publication Data

US 2007/0051778 A1   Mar. 8, 2007

(30) Foreign Application Priority Data

Sep. 7, 2005   (JP) .............................. 2005-259388

(51) Int. Cl.
  *H05K 7/00*   (2006.01)
(52) U.S. Cl. ....................................... 361/760; 361/736
(58) Field of Classification Search ................. 361/760, 361/736, 748; 174/259–262
  See application file for complete search history.

(56) References Cited

U.S. PATENT DOCUMENTS

| 5,679,929 | A |   | 10/1997 | Greenfield et al. |         |
|-----------|---|---|---------|-------------------|---------|
| 5,920,116 | A | * | 7/1999  | Umehara et al.    | 257/669 |
| 6,850,421 | B2| * | 2/2005  | Boyd              | 361/833 |
| 6,998,861 | B2| * | 2/2006  | Nakai et al.      | 324/755 |
| 2007/0006610 | A1 | * | 1/2007 | Kawasaki       | 62/507 |

FOREIGN PATENT DOCUMENTS

| EP | 1 542 517    | 6/2005  |
| EP | 1 603 375    | 12/2005 |
| JP | 62-243393    | 10/1987 |
| JP | 63-157492    | 6/1988  |
| JP | 1-300588     | 12/1989 |
| JP | 05-136551    | 6/1993  |
| JP | 2635323      | 4/1997  |
| JP | 11-126960    | 5/1999  |
| JP | 2000-040869  | 2/2000  |
| JP | 2001-352159  | 12/2001 |
| JP | 2002-280717  | 9/2002  |
| JP | 2005-175186  | 6/2005  |
| JP | 2005-347529  | 12/2005 |

OTHER PUBLICATIONS

European Search Report Application/Patent No. 06254641.1-1235 dated Nov. 15, 2007.

\* cited by examiner

*Primary Examiner*—Hung S Bui
(74) *Attorney, Agent, or Firm*—Buchanan Ingersoll & Rooney PC

(57) ABSTRACT

A printed circuit board 1 including a group of consecutive soldering lands 3 for soldering a lead-type electronic part 2 with a plurality of leads 2a, includes a solder drawing land 4 having a cross-shaped slit 4a and being provided adjacently to a rearmost portion of the group of the consecutive soldering lands 3.

4 Claims, 4 Drawing Sheets

TRAVELING DIRECTION
OF NOZZLE-TYPE SOLDERING

1: PRINTED CIRCUIT BOARD
2: LEAD-TYPE ELECTRONIC PART

TRAVELING DIRECTION
OF NOZZLE-TYPE SOLDERING

1: PRINTED CIRCUIT BOARD
2: LEAD-TYPE ELECTRONIC PART

TRAVELING DIRECTION
OF NOZZLE TYPE-SOLDERING

3: CONSECUTIVE SOLDERING LAND GROUP
4: REAR SOLDER DRAWING LAND

F I G. 3
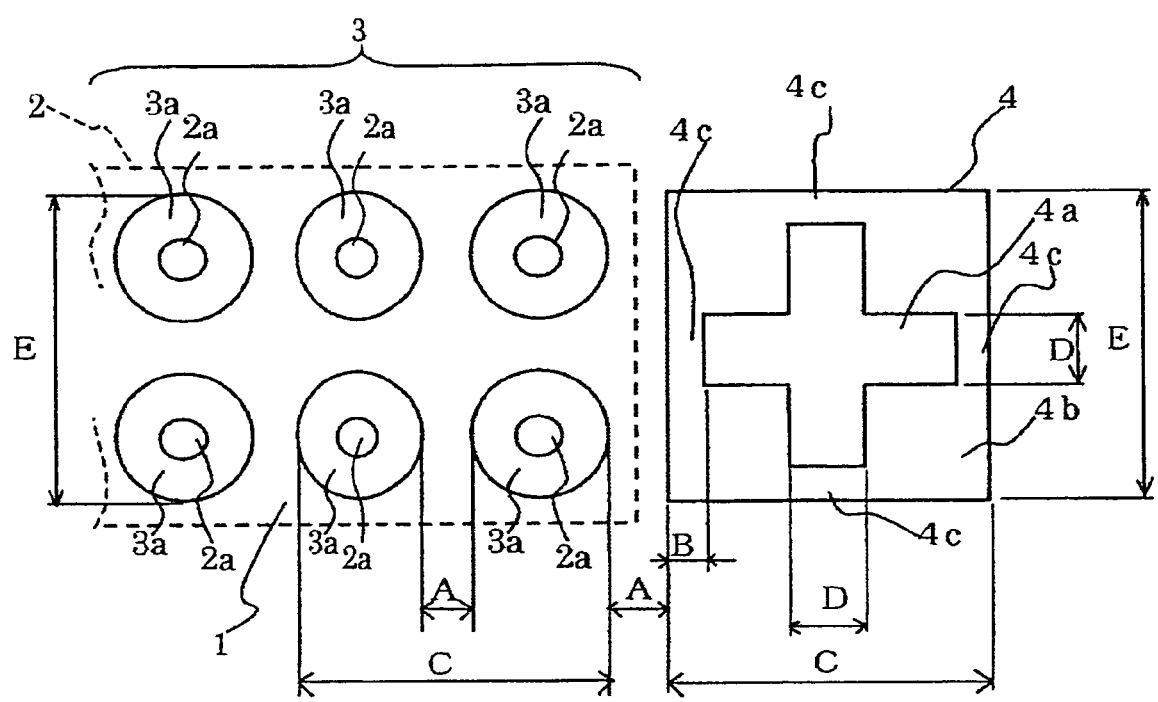

15: ELECTRIC PART BOX

LEAD-TYPE ELECTRONIC-PART-MOUNTED PRINTED CIRCUIT BOARD, METHOD OF SOLDERING LEAD-TYPE ELECTRONIC PART AND AIR-CONDITIONER

BACKGROUND OF THE INVENTION

1. Field of the Invention

The present invention relates to a printed circuit board on which a lead-type electronic part having a plurality of leads is mounted by soldering using a nozzle-type solder bath.

2. Related Arts

In general, since a printed circuit board is increasingly required to accommodate parts in high density thereon, lead-type electronic parts with narrow pitches or the like are required to be mounted on a board. On the other hand, practical application of lead-free solder considering environmental problems is an urgent necessity. However, the lead-free solder is inferior in solderability in comparison with leaded eutectic solder which has been used in the related art, and hence short circuit at soldered portions between lead terminals of the lead-type electronic part or the like has been occurred.

In the related art, in the printed circuit board of this type, such a method has been taken in order to prevent generation of solder bridges that adjacent soldering lands are differentiated in size or shape so as to impair balance of surface tension applied on the solder and cause either one of the soldering lands to absorb the solder. (for example, see Patent Document 1).

Also, another method, in which surface areas of outermost soldering land portions are made larger than others to cause the soldering lands having the larger surface areas on both outer sides to absorb excessive solder has been taken (for example, see Patent Document 2).

Alternatively, a method, in which a flat circular vacant land is provided on a rear side of a soldering land for the lead-type electronic part so as to cause the vacant land to absorb the excessive solder, has been taken (for example, see Patent Document 3).

[Patent Document 1] Japanese Unexamined Patent Application Publication No. 62-243393 (pp. 1 to pp. 2, FIG. 3 to FIG. 4)

[Patent Document 2] Japanese unexamined Patent Application Publication No.63-157492 (pp. 2 to pp. 3, FIG. 1 and FIG. 2).

[Patent Document 3] Japanese Unexamined Patent Application Publication No.01-300588 (pp. 4, FIG. 6)

[Disclosure of the Invention]

[Problems to be Solved by the Invention]

The lead-type electronic-part-mounted printed circuit boards in the related art as described above require precise control of a manufacturing process in order to maintain a stable and high-quality soldering which does not cause solder bridges or solder chips between the leads of the lead-type electronic parts. However, the narrower the pitch of the leads becomes, the more defects of soldering tends to occur when the lead-free solder with low solderability is used, and hence it is difficult to maintain a good accuracy.

SUMMARY OF THE INVENTION

In order to solve the above-described problems, it is an object of the present invention to provide a printed circuit board which ensures prevention of generation of solder bridges (solder short) or solder chips between leads under an easier control even when soldering the lead-type electronic part with narrow pitches, and prevention of occurrence of defects of soldering.

A lead-type electronic-part-mounted printed circuit board according to the invention is a printed circuit board on which a lead-type electronic part with a plurality of leads is mounted by soldering, and which has a group of consecutive soldering lands for the lead-type electronic part and includes a solder drawing land having the cross-shaped slit and being provided adjacently to a rearmost portion of the group of the consecutive soldering lands.

A method of soldering a lead-type electronic part according to the invention is a method of soldering a printed circuit board on which a lead-type electronic part with a plurality of leads is to be mounted and which has a group of the consecutive soldering lands for the lead-type electronic part to be mounted thereon by soldering, including: a mounting step for mounting the lead-type electronic part on the printed circuit board, a flax applying step for applying flax activator on the printed circuit board on which the lead-type electronic part has been mounted during the mounting step, a preheating step for heating the flax activator to an active temperature, a first solder spouting step for soldering all over the lead portion of the lead-type electronic part arranged on a surface of the printed circuit board, and a second solder spouting step for removing solder bridges formed between the leads of the lead-type electronic part during the first solder spouting step with aid of a solder drawing land having a cross-shaped slit and being provided adjacently to a rearmost portion of the group of the soldering lands.

[Advantages]

The lead-type electronic-part-mounted printed circuit board according to the invention includes the solder drawing land having the cross-shaped slit and being provided adjacently to the rearmost portion of the group of the consecutive soldering lands. Therefore, generation of the solder bridges between the leads or the solder chips formed on the group of the soldering lands is advantageously prevented.

The method of soldering the lead-type electronic part according to the invention includes the second solder spouting step for removing the solder bridged formed between the leads of the lead-type electronic part during the first solder spouting step with aid of the solder drawing land having the cross-shaped slit and being provided adjacently to the rearmost portion of the group of the soldering lands. Therefore, surface/interfacial tension of the solder once drawn on the solder drawing land can be dispersed to reduce a force to return to the group of the soldering lands. Consequently, generation of the solder bridges between the leads or the solder chips formed on the group of the soldering lands can be reduced significantly, and an effect to improve operating efficiency is achieved without increasing a finishing work in a post process.

BRIEF DESCRIPTION OF THE DRAWINGS

FIG. 3 is an enlarged plan view of a principal portion showing the portion of the lead-type electronic part shown in FIG. 2 of the lead-type electronic-part-mounted printed circuit board according to the first embodiment of the invention in further enlarged scale to illustrating a relation between a soldering land group and a solder drawing land.

BEST MODE FOR CARRYING OUT THE INVENTION

First Embodiment

Figure 1:
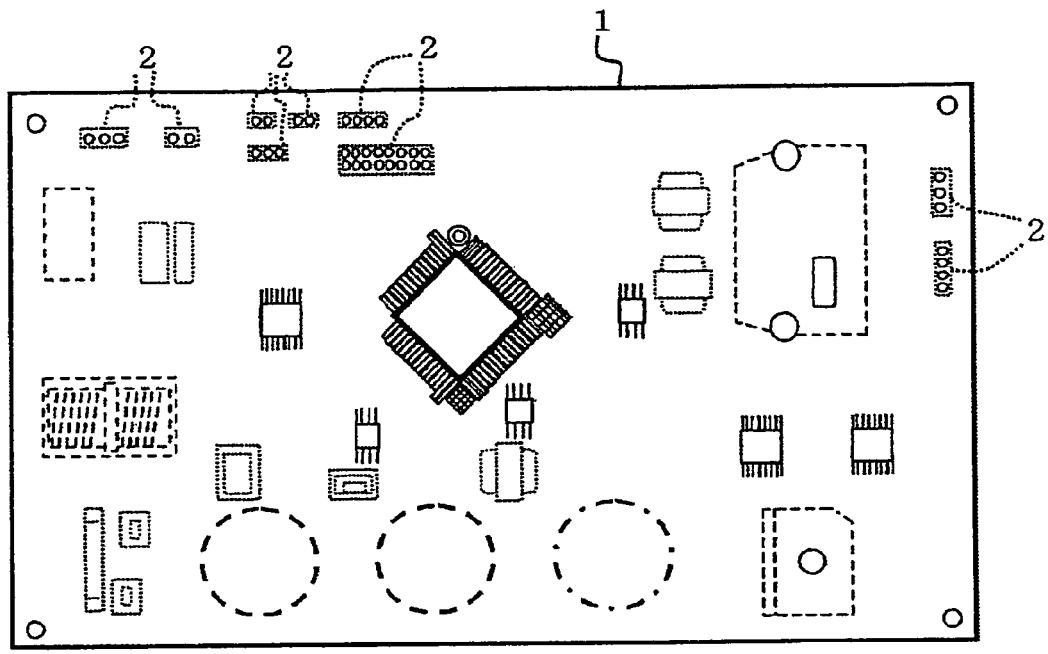
FIG. 1 is a plan view showing a rough layout configuration of a lead-type electronic-part-mounted printed circuit board according to a first embodiment of the invention when viewed from the back side.
Figure 2:
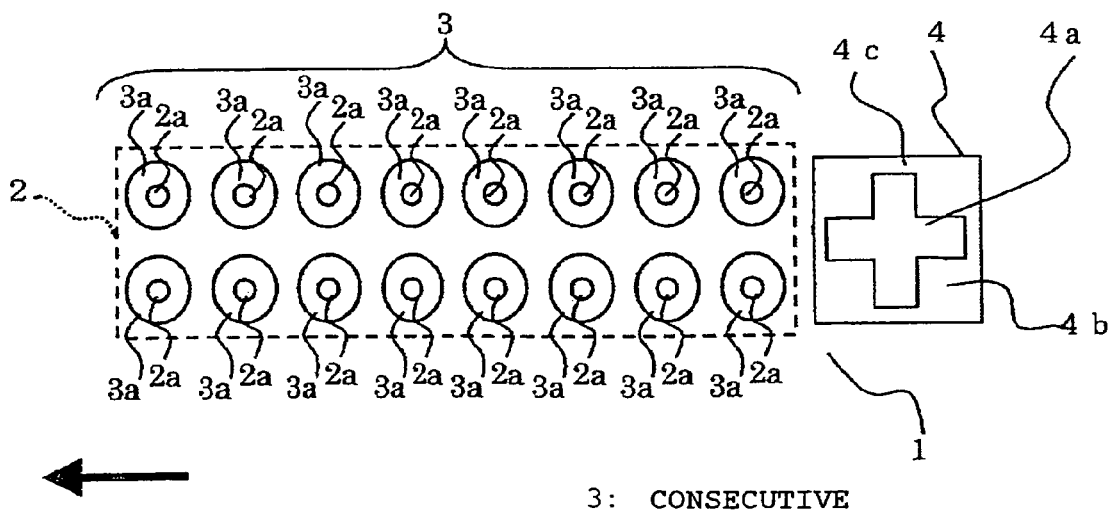
FIG. 2 is an enlarged plan view of a principal portion showing a portion of a lead-type electronic part when viewed from the back side of the lead-type electronic-part-mounted printed circuit board according to the first embodiment of the invention.
Figure 4:
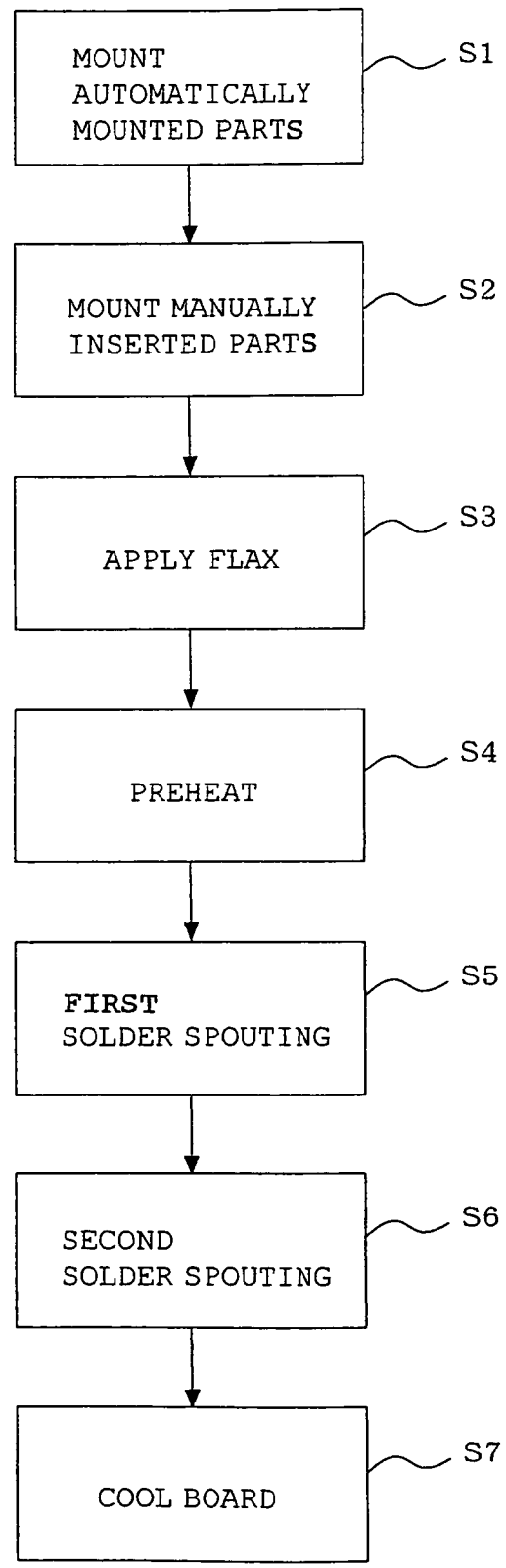
FIG. 4 is a flowchart showing a process of nozzle-type soldering operation for soldering the lead-type electronic part to the lead-type electronic-part-mounted printed circuit board according to the first embodiment of the invention.

Referring now to FIG. 1 to FIG. 4, a lead-type electronic-part-mounted printed circuit board according to a first embodiment of the invention will be described. FIG. 1 is a plan view showing a rough layout configuration of the lead-type electronic-part-mounted printed circuit board according to the first embodiment of the invention when viewed from a back side, FIG. 2 is an enlarged plan view of a principal portion showing a portion of a lead-type electronic part when viewed from the back side of the lead-type electronic-part-mounted printed circuit board according to the first embodiment of the invention; and FIG. 3 is an enlarged plan view of a principal portion showing the portion of the lead-type electronic part shown in FIG. 2 of the lead-type electronic-part-mounted printed circuit board according to the first embodiment of the invention in a further enlarged scale to illustrate a relation between soldering land groups and a solder drawing land. FIG. 4 is a flowchart showing a process of nozzle-type soldering operation for the lead-type electronic part to the lead-type electronic-part-mounted printed circuit board according to the first embodiment of the invention.

In the drawing, a printed circuit board 1 as a lead-type electronic-part-mounted printed circuit board includes parts to be mounted automatically (for example, a chip part resistance, a chip part capacitor, a chip part diode, a discrete resistance, a discrete capacitor, a discrete diode, and so on) (non of these parts is shown in the drawing) and parts to be inserted manually (for example, a large-capacity resistance, a hybrid IC, a transformer, a coil, a large-capacity semiconductor, a large capacitor, and so on) (non of these parts is shown in the drawing) are disposed on a front surface of a printed circuit board 1 as a lead-type electronic-part-mounted printed circuit-board.

In an example shown in FIG. 1, copper foil (not shown) is provided on a back surface of the printed circuit board 1, and several types of the lead-type electronic parts 2 having different size or the like are arranged and mounted horizontally and vertically with respect to a direction indicated by an arrow in FIG. 1, that is, a traveling direction of nozzle-type soldering.

Subsequently, an example of detailed configuration of a portion of one of the lead-type electronic parts 2 to be soldered to the printed circuit board 1 will be described referring to FIG. 2 and FIG. 3. As shown in FIG. 2 and FIG. 3, the printed circuit board 1 is provided with a soldering land group 3 consisting of consecutive soldering lands 3a corresponding to the lead-type electronic part 2. A longitudinal direction of the lead-type electronic part 2, which is a direction in which the respective soldering lands 3a in the soldering land group 3 are arranged consecutively, is oriented in parallel with respect to the traveling direction of the nozzle-type soldering. The printed circuit board 1 is further provided with a rear solder drawing land 4, which has a cross shaped slit 4a and is arranged adjacently to a rearmost portion of the soldering land group 3 constituted by the consecutive soldering lands 3a. Further, in the solder drawing land 4 having the cross-shaped slit 4a which is a portion of no copper foil, a solder drawing portion 4b, which is a portion of copper foil to draw solder, includes connecting portions 4c formed at four positions at the respective distal ends of the cross-shaped slit 4a so as to leave narrow copper foil portions.

In this manner, in this embodiment, an example in which the lead-type electronic part 2 includes 16 leads 2a as lead terminals provided thereon is shown, and the 16 leads 2a are arranged in two rows on the left and right sides with respect to the traveling direction of the nozzle-type soldering indicated by an arrow in FIG. 2, each row including eight leads 2a arranged in parallel with the traveling direction of the nozzle-type soldering. The soldering land group 3 corresponding to the leads 2a is also provided so that the respective soldering lands 3a are arranged in two rows, each row including eight soldering lands 3a, in parallel with the traveling direction of the nozzle-type soldering. The cross-shaped slit 4a formed substantially at a center of the solder drawing land 4 includes vertical and lateral slits which intersect in the cross-shape to form the cross-shaped slit, and the lateral slit is formed in a fore-and-aft direction which is in parallel with the traveling direction of the nozzle-type soldering so that one of the four distal end portions of the cross-shaped slit 4a is directed toward the soldering land group 3 which is the traveling direction of the nozzle-type soldering. The distal end of the cross-shaped slit 4a directed toward the soldering land group 3 is positioned between the left and right rows of the soldering lands 3a in the soldering land group 3, laterally with respect to the traveling direction of the soldering.

In this manner, a main characteristic of the printed circuit board 1 according to the first embodiment of the invention resides in the difference in shape of the rear solder drawing land 4 from the printed circuit board in the related art.

In other words, as shown in FIG. 3, the rear solder drawing land 4 formed of copper foil for drawing solder on the printed circuit board 1 according to the first embodiment of the invention is arranged so as to be spaced from an adjacent soldering land at a distance A, which is substantially the same as the distance A between the soldering lands 3a in the consecutive soldering land group 3, is formed into a square shape having an external size of dimension C×dimension E, in which the dimension C corresponds to a length of two laterally arranged soldering lands 3a in the soldering land group 3 and the dimension E corresponds to a length of two vertically arranged soldering lands 3a of the same. Ultimately, the cross cut-out shaped solder drawing portion 4b is formed by the cross-shaped slit 4a without copper foil positioned at substantially the center in the square shape. As described above, the solder drawing portion 4b of the solder drawing land 4 is provided with the connecting portions 4c formed of copper foil, at the distal ends of the cross shaped slit 4a, so that the connecting portions 4c connects the solder drawing portion 4b, which is partitioned into four sections by the cross-shaped slit 4a, so as to prevent the same from being separated into segments.

As an example of dimensions of the rear solder drawing land 4, the width B of the respective connecting portions 4c formed of the narrow copper foil portions at the four positions at the distal ends of the cross-shaped slit 4a is 0.5 mm, the length D of the respective connecting portions 4C, corresponding to the width of the distal ends of the cross-shaped slit 4a on the front, rear, left and right sides is 1.0 mm, whereby the cross cut-out solder drawing portion 4b is formed.

Subsequently, a procedure of soldering the lead-type electronic part 2 will be described. FIG. 4 is a flowchart showing a process of nozzle-type soldering operation for the lead-type electronic part. Referring to FIG. 4, soldering of the lead-type electronic part 2 to the printed circuit board 1 configured as described above, using a nozzle-type solder bath (not shown) will be described. Firstly, in the first embodiment of the invention, the parts to be mounted automatically (for example, a chip part resistance, a chip part capacitor, a chip part diode, a discrete resistance, a discrete capacitor, a discrete diode, and so on) (not shown in the drawing) and an automatic-mounting-compatible lead-type electronic part 2 are mounted on a front surface and a back surface of the printed circuit board 1 by an automatic mounting machine at Step S1 for a process of mounting parts by the automatic mounting machine. Subsequently, at Step S2 for a process of mounting parts to be manually inserted, the parts to be inserted manually (for example, a large-capacity resistance, the hybrid IC, the transformer, the coil, the large-capacity semiconductor, the large capacitor, and so on) and the manual-mounting-compatible lead-type electronic part 2 is manually inserted and mounted. Subsequently, at Step S3 for a flax application process, flax activator for causing solder to conform to the copper foil is applied to the surface of the lead-type electronic-part-mounted printed circuit board 1. Then, at Step S4 for a preheating process, the flax applied at Step S3 is heated so as to reach an optimal active temperature.

Subsequently, at Step S5 for a first solder spouting process, solder is applied all over to the lead portions of the parts on the back surface of the lead-type electronic-part-mounted printed circuit board 1 from solder spouting means (not shown) for causing solder to be spouted as water from a fountain through a nozzle formed with a number of holes. When the first solder spouting process of Step S5 is ended at Step S6 for a second solder spouting process, solder bridged formed between the leads such as the leads 2a of the lead-type electronic parts 2 during the first solder spouting process is removed by causing the printed circuit board 1 to pass on the flat solder liquid surface in the solder bath in the direction indicated by the arrow in FIG. 1. Finally, the soldered lead-type electronic-part-mounted printed circuit board 1 is cooled at Step S7 for a board cooling process, so that the operation is ended.

Next, soldering of the lead-type electronic part 2 to the soldering land group 3 provided with the rear solder drawing land 4 adjacently to the group of the soldering land group 3 on the rear side with respect to the traveling direction of the nozzle-type soldering will be described further in detail. The lead-type electronic part 2 is mounted and arranged in such a manner that the longitudinal side of the lead-type electronic part 2 is oriented in parallel with the traveling direction of the nozzle-type soldering as shown in FIG. 2, and when the printed circuit board 1 enters into a solder spouting portion in the nozzle-type solder bath, the solder flows rearward along the respective consecutive soldering lands 3a of the soldering land group 3 for the lead-type electronic part 2. At this time, the solder moves rearward while forming bridges in sequence by an action of surface/interfacial tension with respect to the respective lead terminals 2a of the lead-type electronic part 2. The solder moved rearward of the soldering land group 3 is drawn by the rear solder drawing land 4 provided adjacently to the rearmost portion. In this case, a force to cause the solder once drawn to the rear solder drawing land 4 by the action of the surface/interfacial tension to return to the soldering land group 3 consisting of the consecutive soldering lands 3a acts.

Here, the rear solder drawing land 4 proposed in the first embodiment is arranged so as to be spaced from the adjacent soldering land at the distance A, which is substantially the same as the distance A between the respective consecutive soldering lands 3a of the soldering land group 3, has a surface area which is substantially the same as the surface area of the arrangement of the soldering lands 3a, that is, the dimension C×dimension E, in which the dimension C corresponds to the length of two laterally arranged soldering lands 3a in the soldering land group 3 and the dimension E corresponds to the length of two vertically arranged soldering lands 3a of the same, and is provided with the cross-shaped slit formed at its center so as to form the cross cut-out solder drawing portion 4b. This facilitates drawing of the solder from the soldering land group 3 to the rear solder drawing land 4 and, in addition, the surface/interfacial tension of the solder on the rear solder drawing land 4 drawn once is dispersed so that the force to cause the solder to return to the adjacent soldering land group 3 on the front side is reduced. In other words, the solder drawn from the side of the soldering land group 3 to the side of the solder drawing land 4 is distributed and spread smoothly to the solder drawing portion 4b extending in four directions of the solder drawing land 4 divided by the cross-shaped slit 4a and disperses the surface/interfacial tension of the solder on the solder drawing land 4, so that the force to cause the solder to return to the soldering land group 3 which is adjacent to the solder drawing land 4 on the front side thereof is reduced. Consequently, the solder bridges between the leads 2a in the consecutive soldering land group 3 are significantly reduced.

In addition, with the rear solder drawing land 4 having the cross-shaped slit 4a and being provided adjacently to the rearmost portion of the soldering land group 3, the result of an evaluation of a production prototype proves an effect such that the solder drawn into the rear solder drawing land 4 is dispersed uniformly by the connecting portions 4c formed by leaving narrow copper foil portions at four distal ends of the cross-shaped slit 4a, and the amount of the solder on the respective sections of the solder drawing portion 4b of the solder drawing land 4 can be adjusted by the connecting portions 4c formed of narrow copper foil portions, so that foams are not generated in the solder when the solder is dispersed, and generation of solder chips after soldering can be prevented. In other words, owing to the existence of the connecting portions 4c, the solder drawn into the solder drawing portion 4b of the solder drawing land 4 is dispersed uniformly and smoothly to the solder drawing portion 4b in all directions through the connecting portions 4c, and the solder on the solder drawing portion 4b flows from a portion where much solder exists to a portion where less solder exists through the connecting portions 4c, so that the amount of the solder is adjusted smoothly to prevent unevenness of the amount of the solder among the respective sections of the solder drawing portion 4b on the solder drawing land 4. Therefore, the surface/interfacial tension of the solder on the solder drawing land 4 is smoothly dispersed and hence the force to cause the solder to return to the adjacent soldering land group 3 is further reduced, so that foams are not generated in the solder when being dispersed on the solder drawing land 4, which contributes to prevention of generation of solder chips after soldering. Accordingly, an effect to significantly reduce finishing works such as to remove the solder chips manually in the post process and improve the operation efficiency is achieved.

The verification proves that when the rear solder drawing land 4 formed with the cross-shaped slit 4a is not provided and only the shape of the group of the soldering lands is changed or when a flat vacant land corresponding to the soldering land group is provided, the amount of solder short circuits (bridges) generated in the soldering land group is significantly larger than the case of this embodiment of the invention, the amount of generation of the solder chips due to the foams in the solder is also large and, especially in the case of the lead-type electronic parts having the lead terminals arranged in two rows, these phenomena are remarkable.

As described above, according to the lead-type electronic-part-mounted printed circuit board 1 in this embodiment of the invention, the amount of the solder short circuit(bridges), which are generated when the solder moves rearward while forming bridges by the surface/interfacial tension during soldering the lead-type electronic part 2 using the nozzle-type solder bath, and the amount of the solder chips, which are generated due to the foams generated during soldering, can be reliably reduced, so that an effect to reduce the possible locations on which the solder short circuits may occur is obtained.

In this manner, in the case when the lead-type electronic part 2 mounted on the printed circuit board 1 in this embodiment is arranged in parallel to the traveling direction of the nozzle-type soldering, the solder drawing land 4 formed with the cross-shaped slit 4a is provided adjacently to the rearmost portion of the soldering land group 3 and, furthermore, the connecting portions 4c formed of narrow copper foil portions are left at the distal ends of the cross-shaped slit 4a, so that generation of the solder bridges or the solder chips on the soldering land group 3 for the lead-type electronic part 2 can be prevented. In a soldering method of the lead-type electronic part 2 to be mounted to the printed circuit board 1 according to this embodiment, since the surface/interfacial tension of the solder once drawn on the rear solder drawing land 4 is dispersed, the force to cause the solder to return to the soldering land group 3 is reduced. Consequently, the solder bridges between the soldering lands 3a and between the soldering land group 3 and the rear solder drawing land 4 can be significantly reduced, and an effect to improve the operating efficiency is achieved without increasing the finishing work in the post process. Furthermore, since the connecting potions 4c formed of narrow copper foil portions are left at the respective distal ends of the cross-shaped slit 4a, the solder drawn onto the rear solder drawing land 4 is dispersed evenly on the solder drawing portion 4b on the solder drawing land 4, and the amount of the solder on the respective sections of the solder drawing portion 4b on the solder drawing land 4 is adjusted by the connecting portions 4c formed of narrow copper foil portions, so that the foams in the solder are prevented from generating when the solder is dispersed, and generation of the solder chips after soldering is eliminated. Therefore, it is effective for reducing the finishing work in the post process significantly and improving the operating efficiency.

As described above, generation of the solder bridges or the solder chips is effectively prevented. Therefore, even if the lead-free solder with inferior solderability, in which the solder bridges or the solder chips are easily produced because of relatively low flowability and relatively high surface tension, is used, generation of the solder bridges or the solder chips can be prevented, so that the environment friendly lead-free solder can be used and hence the environment friendly printed circuit board can be provided using the lead-free solder.

In the above-described embodiment, an example, in which the solder drawing land 4 is provided for the soldering land group 3 having the two rows of soldering lands 3a to preferably prevent generation of the solder bridges or the solder chips, has been described. However, the number or the number of rows of the consecutive soldering lands 3a in the soldering land group 3 provided with the solder drawing land 4 may be different within a range which can provide the effect to prevent generation of the solder bridges or the solder chips, depending on the shape or the like of the lead-type electronic part 2. The dimensions and the shapes of the rear solder drawing land 4, the slit 4a thereon, the solder drawing portion 4b, the connecting portions 4c in the above-described embodiment are illustrative only, and the invention is not limited thereto. They can be changed as needed by the conditions such as the size and shape of the soldering land group 3 or other parts within the range which can provide an effect to prevent generation of the solder bridges or the solder chips.

Figure 5:
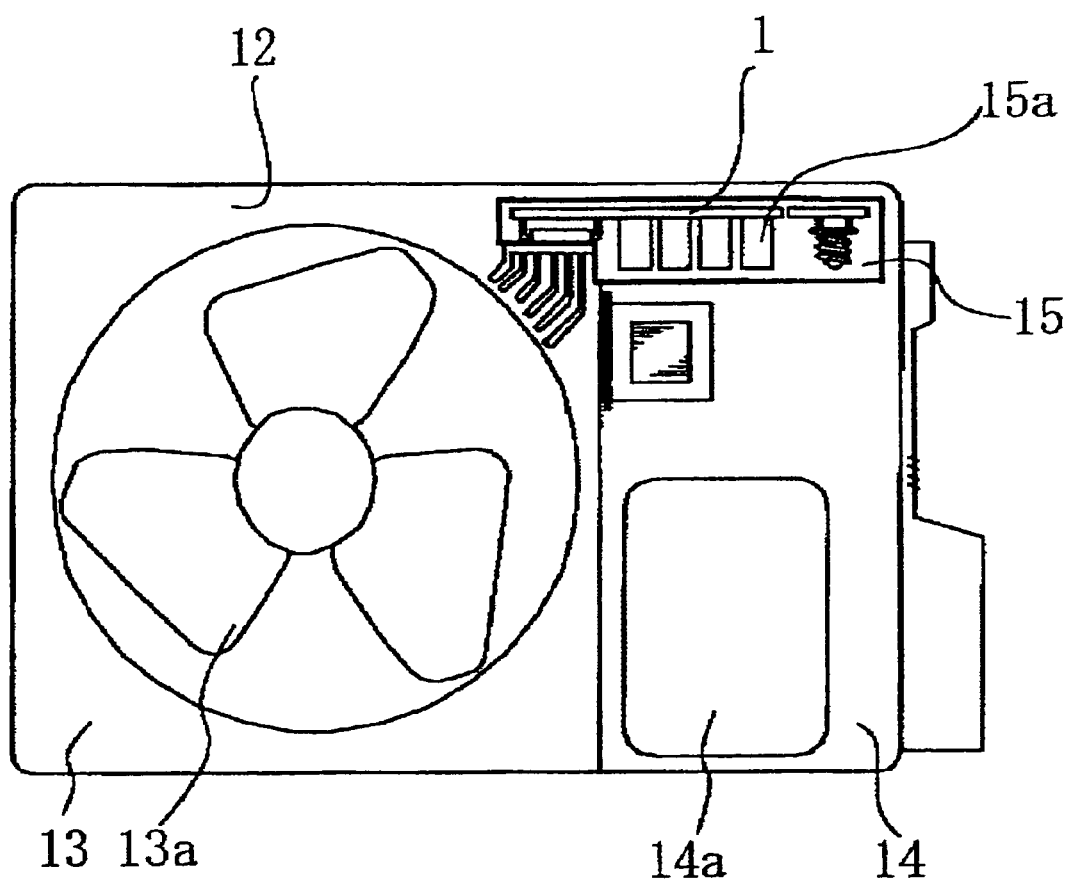
FIG. 5 is a schematic front view of an air-conditioner provided with the lead-type electronic-part-mounted printed circuit board according to the first embodiment of the invention.

Subsequently, an example of usage of the printed circuit board 1 described above will be described. FIG. 5 is a schematic front view of an outdoor unit of an air-conditioner provided with the lead-type electronic-part-mounted printed circuit board according to the first embodiment of the invention. In the drawing, the outdoor unit 12 of the air-conditioner includes an air-blower chamber 13 provided with an air blower 13a, and a compressor chamber 14 including a compressor 14a and a flat-shaped electric part box 15. The electric part box 15 includes the lead-type electronic-part-mounted printed circuit board 1 which is installed therein so that a front surface, on which electric parts 15a are mounted, faces downward, and a flat-shaped back surface having the copper foil faces upward.

Therefore, the electric part box 15, in which the lead-type electronic-part-mounted printed circuit board 1 is installed, can be formed into a flat shape with a small size in the height direction to reduce an installation space, so that a flexibility in space for assembling other parts is increased. Therefore, the assembly is advantageously performed with a sufficient space. The quality of the air-conditioner is advantageously improved with the provision of the lead-type electronic-part-mounted printed circuit board 1 in which generation of the solder bridges and the solder chips is prevented.

In this manner, the lead-type electronic-part-mounted printed circuit board according to the embodiment of the invention is the printed circuit board 1 which has the soldering land group 3 for the lead-type electronic part 2 with the plurality of leads 2a to mount the lead-type electronic part 2 by soldering. The printed circuit board includes the solder drawing land 4 having the cross-shaped slit 4a and being provided adjacently to the rearmost portion of the soldering land group 3. Therefore, generation of the solder bridges between the leads or the solder chips is advantageously prevented on the soldering land group 3.

Since the solder drawing land 4 is provided with the connecting portions 4c formed by leaving the copper foil portions at the distal ends of the cross-shaped slit 4a, a force to cause the solder to return from the solder drawing land 4 to the adjacent soldering land group 3 is reduced, so that generation of the soldering bridges is prevented, and the solder foams are not generated on the solder drawing land 4. Therefore, generation of the solder chips after soldering is advantageously prevented.

In addition, since the lead-free solder is used to solder the lead-type electronic part 2, the environment friendly printed circuit board is advantageously obtained.

The method of soldering the lead-type electronic part according to the embodiment described above is the soldering method to solder the lead-type electronic part 2 with the plurality of leads 2a to the printed circuit board 1 having the soldering land group 3 for the lead-type electronic part 2. The method includes the step for mounting the lead-type electronic part 2 on the printed circuit board 1, the step for applying flax activator on the printed circuit board 1 on which the lead-type electronic part 2 is mounted during the mounting step, the step for preheating to heat the flax activator to the active temperature, the step for first primary solder spouting to solder all over the lead 2a portion of the lead-type electronic parts 2 arranged on the back surface of the printed circuit board 1, and the step for second solder spouting to remove the solder bridges formed between the leads 2a of the lead-type electronic part 2 during the first solder spouting step with aid of the solder drawing land 4 having the cross-shaped slit 4a and being provided adjacently to the rearmost portion of the soldering land group 3. Therefore, the surface/interfacial tension of the solder once drawn on the solder drawing land 4 can be dispersed to reduce the force to return to the soldering land group 3. Consequently, generation of the solder bridges between the leads or the solder chips on the soldering land group 3 can be reduced significantly, and the effect to improve the operating efficiency is achieved without increasing the finishing work in the post process.

In the air-conditioner provide with the lead-type electronic-part-mounted printed circuit board according to the embodiment described above, the outdoor unit 12 of the air-conditioner including the air-blower chamber 13 and the compressor chamber 14 is configured in such a manner that the electric part box 15 arranged at the upper part of the compressor chamber 14 is formed into a flat shape, the printed circuit board 1, on which the lead-type electronic part 2 is mounted by soldering using the nozzle-type solder bath, is installed in the electric part box 15, the solder drawing land 4 having the cross-shaped slit 4a is provided on the printed circuit board so as to be arranged adjacently to the rearmost portion of the soldering land group 3 for the lead-type electronic part 2 which is arranged in parallel with the traveling direction of nozzle-type soldering, and the solder drawing portion 4b includes the connecting portions 4c formed by leaving the narrow copper foil portions at the distal end portions of the cross-type slit 4a. Therefore, The quality of the air-conditioner is advantageously improved with the provision of the lead-type electronic-part-mounted printed circuit board in which generation of the solder bridges between the leads or the solder chips formed on the soldering land group 3 is prevented, and the electric part box 15 in the compressor chamber 14 in the outdoor unit 12 of the air-conditioner is formed into the flat shape to reduce an installation space, so that the flexibility in space for assembling other parts is increased. Therefore, the assembly is advantageously performed with the sufficient space.

1 . . . printed circuit board, 2 . . . lead-type electronic part, 2a . . . lead terminal. 3 . . . soldering land group, 3a . . . soldering land, 4 . . . rear solder drawing land (solder drawing land), 4a . . . cross-shaped slit, 4b . . . solder drawing portion, 4c . . . connecting portion, 12 . . . outdoor unit, 13 . . . air-blower chamber, 14 . . . compressor chamber, 15 . . . electric part box

What is claimed is:

1. A lead-type electronic-part-mounted printed circuit board comprising a printed circuit board on which a lead-type electronic part with a plurality of leads is to be mounted and which has a group of consecutive soldering lands for the lead-type electronic part to be mounted thereon by soldering, comprising:
   a solder drawing land having a cross-shaped slit and being provided adjacently to a rearmost portion of the group of the consecutive soldering lands.

2. The lead-type electronic-part-mounted printed circuit board according to claim 1, wherein the solder drawing land includes connecting portions formed by leaving copper foil portions at distal ends of the cross-shaped slit.

3. The lead-type electronic-part-mounted printed circuit board according to claim 1, wherein lead-free solder is used for soldering the lead-type electronic part.

4. An air-conditioner, wherein an electric part box, in which the lead-type electronic-part-mounted printed circuit board according to claim 1 is stored, is arranged above a compressor in a compressor chamber.

* * * * *